(12) United States Patent
Xiong

(10) Patent No.: US 9,766,521 B2
(45) Date of Patent: Sep. 19, 2017

(54) METHOD FOR MANUFACTURING BLACK MATRIX WITH EASY RECOGNITION OF ALIGNMENT MARK

(71) Applicant: Shenzhen China Star Optoelectronics Technology Co., Ltd., Shenzhen (CN)

(72) Inventor: Yuan Xiong, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 54 days.

(21) Appl. No.: 14/786,165

(22) PCT Filed: Oct. 10, 2015

(86) PCT No.: PCT/CN2015/091645
§ 371 (c)(1),
(2) Date: Oct. 22, 2015

(87) PCT Pub. No.: WO2016/173210
PCT Pub. Date: Nov. 3, 2016

(65) Prior Publication Data
US 2017/0097549 A1    Apr. 6, 2017

(30) Foreign Application Priority Data
Apr. 28, 2015 (CN) .......................... 2015 1 0208717

(51) Int. Cl.
*H01L 29/786* (2006.01)
*G02F 1/1362* (2006.01)
(Continued)

(52) U.S. Cl.
CPC .... *G02F 1/136209* (2013.01); *H01L 21/0273* (2013.01); *H01L 21/681* (2013.01);
(Continued)

(58) Field of Classification Search
CPC . H01L 23/544; H01L 21/0273; H01L 21/681; H01L 27/1288
See application file for complete search history.

(56) References Cited

U.S. PATENT DOCUMENTS

| | | | | |
|---|---|---|---|---|
| 5,514,503 A | * | 5/1996 | Evans | B41M 1/10 156/240 |
| 6,342,935 B1 | * | 1/2002 | Jang | G02F 1/133553 349/113 |
| 2013/0292680 A1 | * | 11/2013 | Kim | H01L 29/41733 257/59 |

FOREIGN PATENT DOCUMENTS

| CN | 101598878 A | * | 12/2009 |
|---|---|---|---|
| CN | 101598878 A | | 12/2009 |

OTHER PUBLICATIONS

Machine translation of CN 101598878 A, downloaded Jan. 24, 2017.*

* cited by examiner

*Primary Examiner* — Benjamin Sandvik
*Assistant Examiner* — Damon Hillman
(74) *Attorney, Agent, or Firm* — Leong C. Lei

(57) ABSTRACT

The present invention provides a manufacture method of a black matrix. The COA technology is utilized to manufacture the organic photoresist blocks with a larger thickness on the alignment marks. Then, the black matrix thin film covers on the organic photoresist blocks to tremendously increase the level differences of the positions of the alignment marks and adjacent areas. Thus, the contour recognition apparatus is employed to accurately recognize positions of the alignment marks. The issue that the alignment marks are difficult to be recognized after the black matrix thin film is coated in the BOA process can be solved.

12 Claims, 5 Drawing Sheets

(51) Int. Cl.
*H01L 23/544* (2006.01)
*H01L 21/027* (2006.01)
*H01L 27/12* (2006.01)
*H01L 21/68* (2006.01)
*G02F 1/1333* (2006.01)

(52) U.S. Cl.
CPC ........ *H01L 23/544* (2013.01); *H01L 27/1288* (2013.01); *G02F 2001/133354* (2013.01); *G02F 2001/136222* (2013.01); *H01L 2223/54426* (2013.01)

METHOD FOR MANUFACTURING BLACK MATRIX WITH EASY RECOGNITION OF ALIGNMENT MARK

FIELD OF THE INVENTION

The present invention relates to a display technology field, and more particularly to a manufacture method of a black matrix.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

Generally, the liquid crystal display panel comprises a CF (Color Filter) substrate, a TFT (Thin Film Transistor) array substrate, LC (Liquid Crystal) sandwiched between the CF substrate and TFT substrate and sealant. The formation process generally comprises: a forepart Array process (thin film, photo, etching and stripping), a middle Cell process (Lamination of the TFT substrate and the CF substrate) and a post module assembly process (Attachment of the driving IC and the printed circuit board). The forepart Array process is mainly to form the TFT substrate for controlling the movement of the liquid crystal molecules; the middle Cell process is mainly to add liquid crystal between the TFT substrate and the CF substrate; the post module assembly process is mainly the driving IC attachment and the integration of the printed circuit board. Thus, the liquid crystal molecules are driven to rotate and display pictures.

In the traditional liquid crystal display panel, At one side of the color filter, a layer of BM (Black Matrix) is manufactured which is employed to divide adjacent color resists to shield the gaps of the color resists and to prevent the light leakage or the color mix; the skill of manufacturing the black matrix on the TFT array substrate is called BOA (BM On Array, the Black Matrix is adhered on the array substrate). BOA can solve the problems that the shielding areas do not match due to the upper, lower substrates misalignment, which particularly useful to the curved display. COA (Color filter On Array) technology is a skill to manufacture the RGB color resists which are previously manufactured on the color filter on the TFT array substrate. The COA technology can improve the signal delay on the metal line to raise the panel aperture ratio and improve the display quality of the panel.

FIG. 1 is a diagram of a color filter after a black matrix is manufactured. As shown in FIG. 1, the black matrix 200 is a first manufacture process of the color filter 100. Therefore, referring the alignment mark of the previous process is not necessary for the manufacture process of the black matrix. In the liquid crystal display panel of BOA structure, the black matrix is manufactured at onside of the array substrate. Before manufacturing the black matrix, the processes of other patterns have already been accomplished. Thus, referring the alignment mark of the previous process is not necessary as manufacturing the black matrix. However, the black matrix has higher OD (optical density). Thus, it will cause interference to the recognition to the mask alignment mark after the coating, and might result in the unable alignment of the stepper. If the black matrix material having lower optical density is used, the recognition ability of the alignment mark after coating can be improved but the shielding result of the black matrix can be seriously influenced.

FIG. 2 is a diagram of a TFT array substrate coated a black matrix color resist system. FIG. 3 is a sectional diagram of a circle area in FIG. 2. As shown in FIG. 2, FIG. 3, after the TFT array substrate 300 is coated with the black matrix thin film 400, the black matrix thin film 400 completely covers the alignment mask 500. Because the typical value of the thickness of the black matrix thin film 400 is 1 μm, and after it covers the alignment mask 500, the level difference d1 of the position of the alignment mask 500 and the adjacent area is reduced. Therefore, even utilizing the method of contour recognition is very difficult to recognize the accurate position of the alignment mask 500.

SUMMARY OF THE INVENTION

An objective of the present invention is to provide a manufacture method of a black matrix. By increasing the level differences of the positions of the alignment marks and adjacent areas, the method of contour recognition can be utilized to recognize positions of the alignment marks after the black matrix thin film is coated. After accurately positioning, the black matrix thin film is patterned to form a design pattern of the black matrix for solving the issue that the alignment marks are difficult to be recognized in the manufacture process of the black matrix thin film in the BOA structure.

For realizing the aforesaid objective, the present invention provides a manufacture method of a black matrix, comprising steps of:

step 1, providing a substrate, and a plurality of alignment marks are provided on the substrate;

step 2, manufacturing an organic photoresist layer on the substrate, and the photoresist layer comprises a plurality of organic photoresist blocks respectively covering the plurality of alignment marks;

step 3, coating a black matrix thin film on the substrate and the organic photoresist layer;

step 4, employing a contour recognition apparatus to recognize positions of the alignment marks based on level differences formed by the positions of the alignment marks and adjacent areas on the substrate, and after accurately positioning, patterning the black matrix thin film to form the black matrix.

In the step 1, the substrate is a TFT array substrate.

The substrate is a rectangular structure, and there are four alignment marks respectively located at four corners of the rectangular.

Both the alignment marks and the organic photoresist blocks are cross structures, and sizes of the two are the same.

The organic photoresist blocks are color resist blocks.

A thickness of the organic photoresist blocks is 3 μm.

A thickness of the black matrix thin film is 1 μm.

In the step 4, the level differences of the positions of the alignment marks and adjacent areas are larger than 2 μm.

In the step 4, the level differences of the positions of the alignment marks and adjacent areas are 3 μm.

In the step 4, the contour recognition apparatus is a camera lens having difference modes or a CCD probe.

The present invention further provides a manufacture method of a black matrix, comprising steps of:

step 1, providing a substrate, and a plurality of alignment marks are provided on the substrate;

step 2, manufacturing an organic photoresist layer on the substrate, and the photoresist layer comprises a plurality of organic photoresist blocks respectively covering the plurality of alignment marks;

step 3, coating a black matrix thin film on the substrate and the organic photoresist layer;

step 4, employing a contour recognition apparatus to recognize positions of the alignment marks based on level differences formed by the positions of the alignment marks and adjacent areas on the substrate, and after accurately positioning, patterning the black matrix thin film to form the black matrix;

wherein in the step 1, the substrate is a TFT array substrate.

wherein the substrate is a rectangular structure, and there are four alignment marks respectively located at four corners of the rectangular;

wherein both the alignment marks and the organic photoresist blocks are cross structures, and sizes of the two are the same;

wherein the organic photoresist blocks are color resist blocks;

wherein in the step 4, the contour recognition apparatus is a camera lens having difference modes or a CCD probe.

The benefits of the present invention are: the present invention provides a manufacture method of a black matrix. The COA technology is utilized to manufacture the organic photoresist blocks with a larger thickness on the alignment marks. Then, the black matrix thin film covers on the organic photoresist blocks to tremendously increase the level differences of the positions of the alignment marks and adjacent areas. Thus, the contour recognition apparatus can be employed to accurately recognize positions of the alignment marks. Accordingly, the issue that the alignment marks are difficult to be recognized after the black matrix thin film is coated in the BOA process can be solved.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
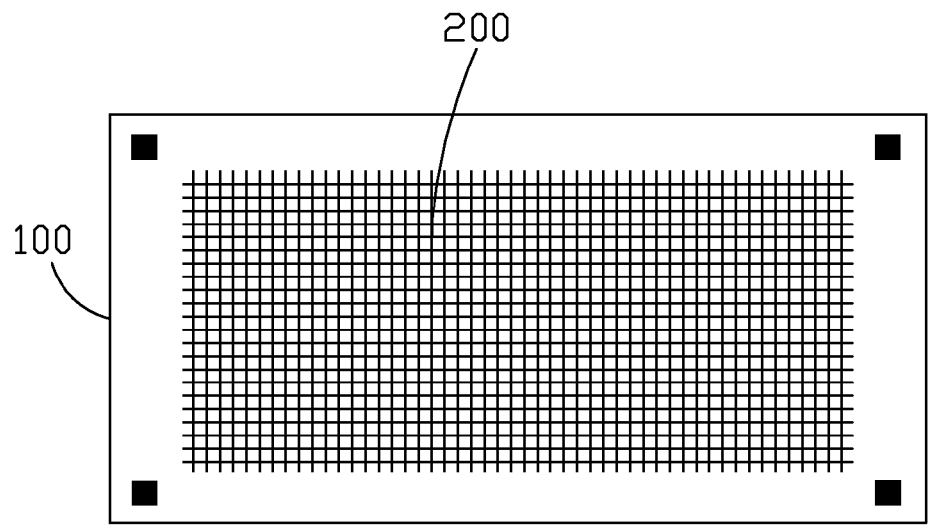
FIG. 1 is a diagram of a color filter after a black matrix is manufactured.
Figure 2:
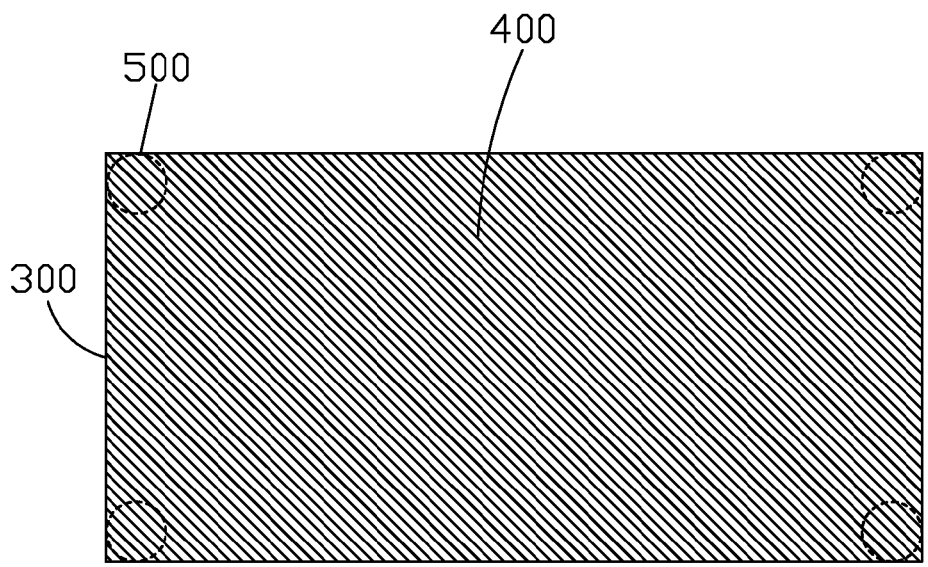
FIG. 2 is a diagram of a TFT array substrate coated a black matrix color resist system.
Figure 3:
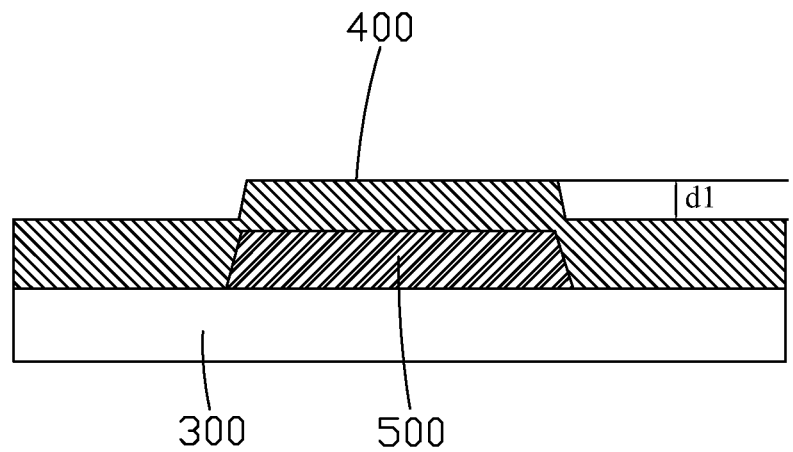
FIG. 3 is a sectional diagram of a circle area in FIG. 2.
Figure 4:
FIG. 4 is a diagram of the step 1 in a manufacture method of a black matrix according to the present invention.
Figure 5:
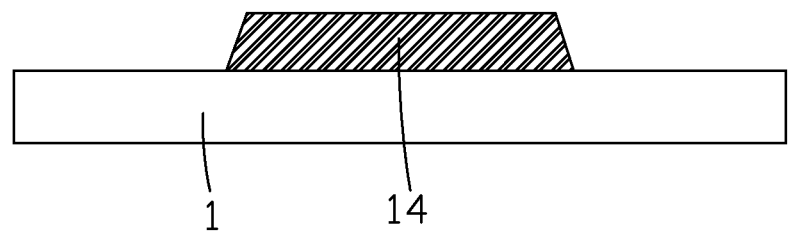
FIG. 5 is a sectional diagram of A-A portion in FIG. 4.

Please refer to FIGS. 4-10. The present invention provides a manufacture method of a black matrix, comprising steps of:

step 1, as shown in FIGS. 4-5, providing a substrate 1, and a plurality of alignment marks 14 are provided on the substrate 1.

Specifically, the substrate 1 is a TFT array substrate.

Preferably, the substrate 1 is a rectangular structure, and there are four alignment marks 14 respectively located at four corners of the rectangular.

Figure 6:
FIG. 6 is a diagram of the step 2 in a manufacture method of a black matrix according to the present invention.
Figure 7:
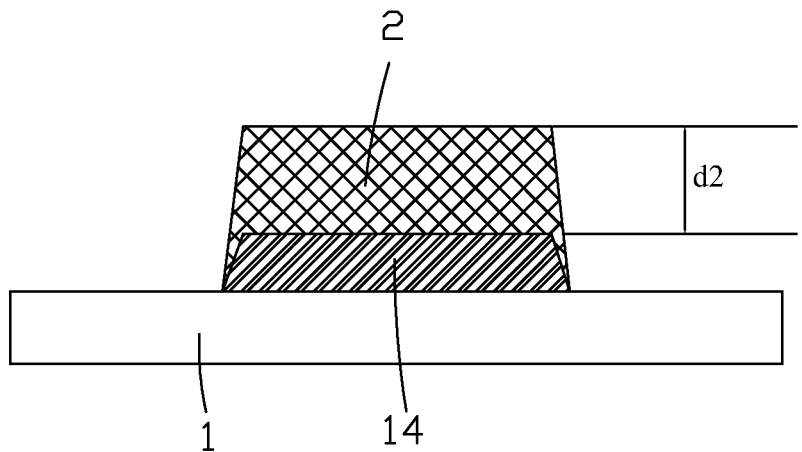
FIG. 7 is a sectional diagram of A-A portion in FIG. 6.

Preferably, the alignment marks 14 are cross structures.

step 2, as shown in FIGS. 6-7, manufacturing an organic photoresist layer on the substrate 1, and the photoresist layer comprises a plurality of organic photoresist blocks 2 respectively covering the plurality of alignment marks 14.

Specifically, the organic photoresist layer comprises four organic photoresist blocks 2. The shape of the organic photoresist block 2 is the same as that of the alignment mark 14, which both are cross structures. The size of the organic photoresist block 2 is basically the same as the size of the alignment mark 14.

Specifically, the organic photoresist blocks 2 are color resist blocks, such as red, green, or blue resist blocks.

Preferably, a thickness d2 of the organic photoresist blocks 2 is 3 μm. The organic photoresist blocks 2 are employed to increase the level differences of the positions of the alignment marks 14 and adjacent areas on the substrate 1 to promote the recognition accuracy of the contour recognition apparatus.

Figure 8:
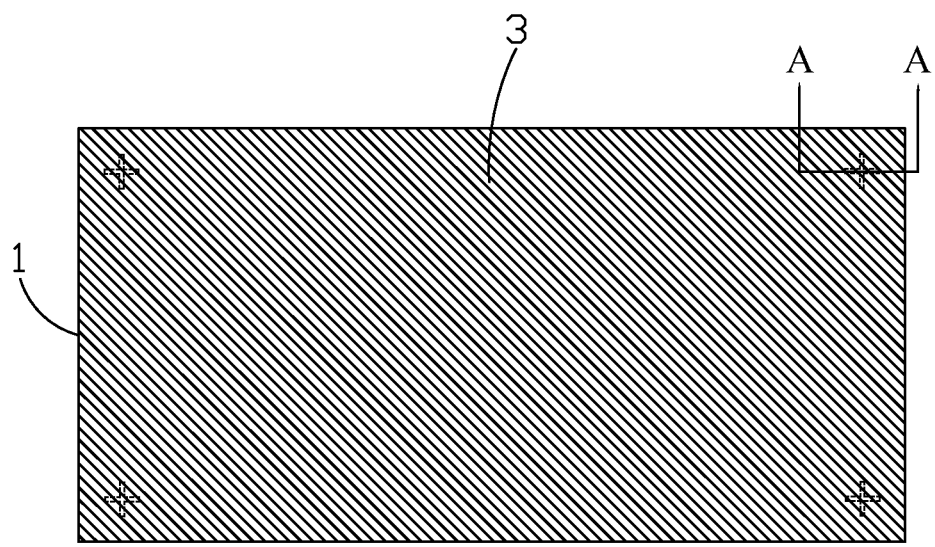
FIG. 8 is a diagram of the step 3 in a manufacture method of a black matrix according to the present invention.
Figure 9:
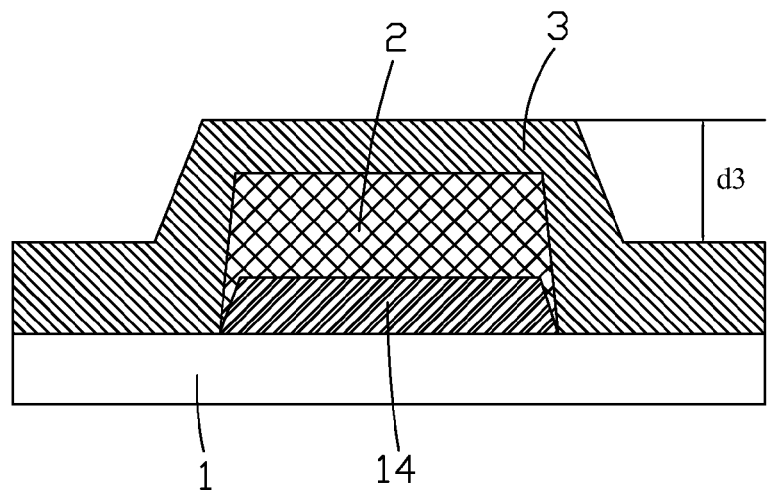
FIG. 9 is a sectional diagram of A-A portion in FIG. 8.

The COA (color filter on array) technology is a skill to manufacture the color filter (generally formed with color resists) on the TFT array substrate. The step 2 utilizes the method of the COA technology to manufacture the organic photoresist blocks (such as color resist blocks) on the alignment mark of the TFT array substrate. Thus, the level differences of the positions of the alignment marks 14 and adjacent areas on the substrate is increased and beneficial for employing the contour recognition apparatus to recognize positions of the alignment marks 14 in the following step and promoting the recognition accuracy.

step 3, as shown in FIGS. 8-9, coating a black matrix thin film 3 on the substrate 1 and the organic photoresist layer.

Figure 10:
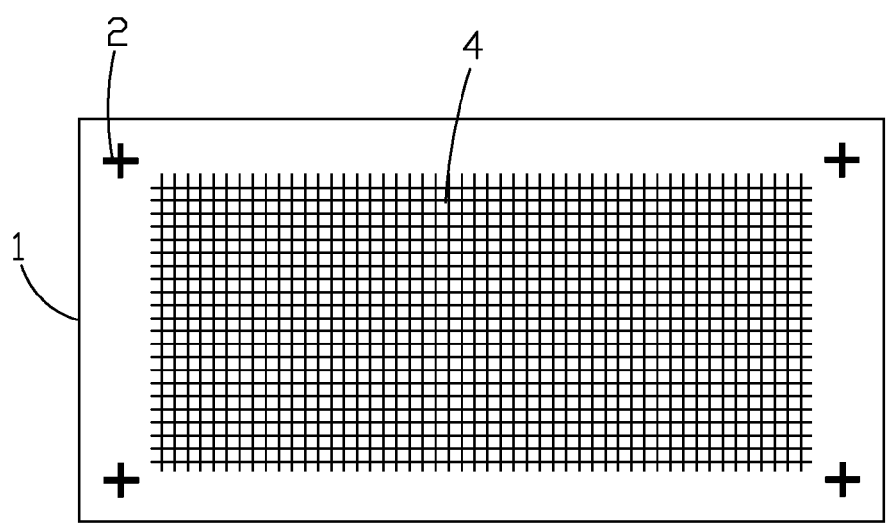
FIG. 10 is a diagram of the step 4 in a manufacture method of a black matrix according to the present invention.

Preferably, a thickness of the black matrix thin film 3 is 1 μm.

step 4, as shown in FIG. 10, employing a contour recognition apparatus to recognize positions of the alignment marks 14 base on level differences d3 formed by the positions of the alignment marks 14 and adjacent areas on the substrate 1, and after accurately positioning, patterning the black matrix thin film 3 to form the black matrix 4.

Specifically, the level differences d3 of the positions of the alignment marks 14 and adjacent areas on the substrate 1 are 3 μm.

In the TFT array substrate according to prior art, the level differences d1 of the positions of the alignment marks and adjacent areas are generally smaller than 1 μm. Because the level difference is smaller, the method of contour recognition is difficult to recognize the accurate positions of the alignment marks. In the manufacture method of a black matrix according to the present application, by adding an organic photoresist block 2 on the alignment mark 14, the level difference d3 of the position of the alignment mark 14 and adjacent area on the substrate 1 is larger than 2 μm after the black matrix thin film 3 is coated. Thus, the accurate recognition of the contour recognition apparatus to the position of the alignment mark 14 can be ensured; in comparison with the method of directly coating the black matrix thin film on the alignment mark according to prior art, the level differences of the positions of the alignment marks and adjacent areas are tremendously increased to promote the recognition accuracy of the contour recognition apparatus.

Specifically, the contour recognition apparatus is a camera lens having difference modes or a CCD (Charge-coupled Device) probe.

In conclusion, the present invention provides a manufacture method of a black matrix. The COA technology is utilized to manufacture the organic photoresist blocks with a larger thickness on the alignment marks. Then, the black matrix thin film covers on the organic photoresist blocks to tremendously increase the level differences of the positions of the alignment marks and adjacent areas. Thus, the contour recognition apparatus can be employed to accurately recognize positions of the alignment marks. Accordingly, the issue that the alignment marks are difficult to be recognized after the black matrix thin film is coated in the BOA process can be solved.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a black matrix, comprising steps of:
    step 1, providing a substrate, and a plurality of alignment marks are provided on the substrate;
    step 2, manufacturing an organic photoresist layer on the substrate, and the photoresist layer comprises a plurality of organic photoresist blocks respectively covering the plurality of alignment marks;
    step 3, coating a black matrix thin film on the substrate and the organic photoresist layer;
    step 4, employing a contour recognition apparatus to recognize positions of the alignment marks based on level differences formed by the positions of the alignment marks and adjacent areas on the substrate, and after accurately positioning, patterning the black matrix thin film to form the black matrix;
    wherein the organic photoresist blocks have a thickness of 3 μm; the black matrix thin film has a thickness of 1 μm; and the level differences formed by the positions of the alignment marks and the adjacent areas are larger than 2 μm.

2. The manufacture method of the black matrix according to claim 1, wherein in the step 1, the substrate is a TFT array substrate.

3. The manufacture method of the black matrix according to claim 1, wherein the substrate is a rectangular structure, and there are four alignment marks respectively located at four corners of the rectangular.

4. The manufacture method of the black matrix according to claim 1, wherein both the alignment marks and the organic photoresist blocks are cross structures, and sizes of the two are the same.

5. The manufacture method of the black matrix according to claim 1, wherein the organic photoresist blocks are color resist blocks.

6. The manufacture method of the black matrix according to claim 1, wherein the level differences of the positions of the alignment marks and the adjacent areas are 3 μm.

7. The manufacture method of the black matrix according to claim 1, wherein in the step 4, the contour recognition apparatus is a camera lens having difference modes or a CCD probe.

8. A manufacture method of a black matrix, comprising steps of:
    step 1, providing a substrate, and a plurality of alignment marks are provided on the substrate;
    step 2, manufacturing an organic photoresist layer on the substrate, and the photoresist layer comprises a plurality of organic photoresist blocks respectively covering the plurality of alignment marks;
    step 3, coating a black matrix thin film on the substrate and the organic photoresist layer;
    step 4, employing a contour recognition apparatus to recognize positions of the alignment marks based on level differences formed by the positions of the alignment marks and adjacent areas on the substrate, and after accurately positioning, patterning the black matrix thin film to form the black matrix;
    wherein in the step 1, the substrate is a TFT array substrate;
    wherein the substrate is a rectangular structure, and there are four alignment marks respectively located at four corners of the rectangular;
    wherein both the alignment marks and the organic photoresist blocks are cross structures, and sizes of the two are the same;
    wherein the organic photoresist blocks are color resist blocks;
    wherein in the step 4, the contour recognition apparatus is a camera lens having difference modes or a CCD probe.

9. The manufacture method of the black matrix according to claim 8, wherein a thickness of the organic photoresist blocks is 3 μm.

10. The manufacture method of the black matrix according to claim 9, wherein a thickness of the black matrix thin film is 1 μm.

11. The manufacture method of the black matrix according to claim 10, wherein in the step 4, the level differences of the positions of the alignment marks and adjacent areas are larger than 2 μm.

12. The manufacture method of the black matrix according to claim 11, wherein in the step 4, the level differences of the positions of the alignment marks and adjacent areas are 3 μm.

* * * * *